US012769013B2

(12) United States Patent
Olson et al.

(10) Patent No.: US 12,769,013 B2
(45) Date of Patent: Oct. 20, 2026

(54) TIMING SIGNALS COMPARISON FOR INTERFERENCE DETECTION

(71) Applicant: ColdQuanta, Inc., Boulder, CO (US)

(72) Inventors: Judith Olson, Northglenn, CO (US); Ronald Shane Fazzio, Denver, CO (US); Robert James Fasano, Boulder, CO (US)

(73) Assignee: Infleqtion Quantum, LLC, Louisville, CO (US)

( * ) Notice: Subject to any disclaimer, the term of this patent is extended or adjusted under 35 U.S.C. 154(b) by 0 days.

(21) Appl. No.: 18/974,012

(22) Filed: Dec. 9, 2024

(65) Prior Publication Data

US 2025/0189677 A1 Jun. 12, 2025

Related U.S. Application Data

(60) Provisional application No. 63/607,980, filed on Dec. 8, 2023.

(51) Int. Cl.
*G01S 19/21* (2010.01)
*H03L 7/26* (2006.01)

(52) U.S. Cl.
CPC .............. *G01S 19/215* (2013.01); *H03L 7/26* (2013.01)

(58) Field of Classification Search
CPC .......... G01S 19/00; G01S 19/01; G01S 19/13; G01S 19/015; G01S 19/21; G01S 19/215; H03L 7/00; H03L 7/26; H03L 7/06; H03L 7/08; H03L 7/10; H03L 7/113
See application file for complete search history.

(56) References Cited

U.S. PATENT DOCUMENTS

| | | | | |
|---|---|---|---|---|
| 9,766,343 | B2 * | 9/2017 | Schleppe | G01S 19/215 |
| 10,162,061 | B2 * | 12/2018 | Kim | G01S 19/215 |
| 11,444,769 | B2 * | 9/2022 | Wentz | G01S 19/14 |
| 11,754,979 | B2 * | 9/2023 | Salim | G04F 5/145 331/94.1 |
| 11,824,635 | B1 * | 11/2023 | Byagowi | G06F 1/14 |
| 11,916,350 | B2 * | 2/2024 | Olson | H01S 3/1305 |
| 12,028,084 | B2 * | 7/2024 | Salim | H04B 10/70 |
| 12,126,349 | B2 * | 10/2024 | Anderson | G01P 15/08 |
| 12,160,242 | B1 * | 12/2024 | Autry | H01S 5/02375 |
| 12,261,614 | B2 * | 3/2025 | Anderson | G01P 15/08 |
| 12,273,118 | B2 * | 4/2025 | Olson | H03L 7/26 |
| 12,298,721 | B2 * | 5/2025 | Salim | G04F 5/14 |
| 2002/0183070 | A1 * | 12/2002 | Bloebaum | G01S 19/21 455/456.1 |
| 2004/0266342 | A1 * | 12/2004 | Kontola | G01S 19/21 455/12.1 |
| 2010/0321117 | A1 * | 12/2010 | Gan | H03L 7/26 331/3 |

(Continued)

*Primary Examiner* — James M Perez
(74) *Attorney, Agent, or Firm* — Schwegman Lundberg & Woessner, P.A.

(57) ABSTRACT

A system includes an atomic clock providing a local reference clock signal, an external clock interface receiving an external clock signal, and a comparator comparing the local and external clock signals. In response, the comparator generates a comparison output signal. An interference detection system receives this signal and determines if the external clock signal contains an interference component. The system then outputs an alert signal to indicate the presence of interference.

9 Claims, 3 Drawing Sheets

(56) References Cited

U.S. PATENT DOCUMENTS

| | | | | |
|---|---|---|---|---|
| 2013/0063308 | A1* | 3/2013 | Krasner | G01S 19/21 342/393 |
| 2015/0219460 | A1* | 8/2015 | Gmerek | G01C 21/20 701/468 |
| 2015/0358026 | A1* | 12/2015 | Gan | H03L 7/26 331/94.1 |
| 2016/0223677 | A1* | 8/2016 | Trevino | G01S 19/215 |
| 2016/0223678 | A1* | 8/2016 | Kim | G01S 19/215 |
| 2016/0259062 | A1* | 9/2016 | Raghupathy | G01S 19/48 |
| 2017/0257840 | A1* | 9/2017 | Wang | H04W 4/029 |
| 2018/0196142 | A1* | 7/2018 | Levy | G01S 19/015 |
| 2019/0154839 | A1* | 5/2019 | Ashjaee | G01S 19/215 |
| 2021/0072401 | A1* | 3/2021 | Colli-Vignarelli | G01S 19/215 |
| 2021/0109227 | A1* | 4/2021 | Jones | G01S 19/215 |
| 2021/0311203 | A1* | 10/2021 | Reis | G01S 19/00 |
| 2021/0333411 | A1* | 10/2021 | Gum | G01S 19/215 |
| 2022/0221588 | A1* | 7/2022 | Elgersma | G01S 19/215 |
| 2023/0341559 | A1* | 10/2023 | Sapp | G01S 19/015 |
| 2024/0045075 | A1* | 2/2024 | Dhaliwal | H04K 3/90 |
| 2024/0146319 | A1* | 5/2024 | Olson | G04F 5/14 |
| 2024/0345259 | A1* | 10/2024 | Sheikh | G01S 19/21 |
| 2024/0369715 | A1* | 11/2024 | Bandi | G01S 19/215 |
| 2025/0125943 | A1* | 4/2025 | Fasano | G04F 5/14 |
| 2025/0189677 | A1* | 6/2025 | Olson | G01S 19/215 |
| 2025/0284248 | A1* | 9/2025 | Fasano | G04F 5/14 |

* cited by examiner

TIMING SIGNALS COMPARISON FOR INTERFERENCE DETECTION

CROSS-REFERENCE TO RELATED APPLICATIONS

This application claims the benefit of priority to U.S. Provisional Patent Application Ser. No. 63/607,980, filed Dec. 8, 2023, which is incorporated by reference herein in its entirety.

BACKGROUND OF THE INVENTION

Global positioning system (GPS) timing signals can be manipulated through spoofing or jamming techniques, posing serious threats to the reliability and accuracy of GPS-based systems.

Spoofing involves creating counterfeit GPS signals that mimic authentic GPS signals. Malicious actors can broadcast the counterfeit GPS signal(s) at a higher signal strength, with altered timing, or any other technique that cause GPS receivers to calculate incorrect position and timing information. As a consequence of a spoofed signal, a device can report a location or a time different from an actual location (or an actual time) of the device (or time). Jamming disrupts a GPS receiver from receiving authentic GPS signals by flooding the GPS frequency band with noise or high-intensity signals, rendering the GPS receiver unable to determine accurate positioning or timing information.

Malicious actors can use spoofing and jamming techniques separately or in combination, which can create challenges in securing GPS-dependent systems against potential disruptions or manipulations. A disruption can have a large impact due to the number of systems and sub-systems that rely on GPS timing signals which are also part of global infrastructure, such as electric grids, data networks, transportation networks, etc.

BRIEF DESCRIPTION OF THE DRAWINGS

Various embodiments of the invention are disclosed in the following detailed description and the accompanying drawings.

DETAILED DESCRIPTION

When a GPS signal is being disrupted due to spoofing, jamming, or both, systems that receive that GPS signal are unable to detect the compromised nature (e.g., spoofed, jammed) of the GPS signal. Accordingly, mechanisms to detect and to indicate anomalies of an external timing signal, such as GPS time, are desirable.

Various described examples can include system including an atomic clock providing a local clock signal, and a receiver that accepts an external timing reference signal. The system compares the local clock signal to the external timing reference signal. When the timing signals (e.g., comparison results) begin to diverge, a warning may be generated. When the external timing reference is a GPS signal, or signal generated by another geolocation system, an indication (e.g., a flag) may be generated that the external timing reference signal is corrupted or compromised. The system may slew or perform a coarse step between the two references so that the local clock signal is output by the system while the external timing reference signal is deemed to be compromised.

The system can periodically re-check the comparison results to determine whether the external timing reference remains compromised. When the system determines that the external timing reference signal is no longer compromised, the system may slew between the two clock references such that the external timing reference signal is output and the local clock signal is inhibited from being output. Accordingly, detection of interference in a timing signal may be automated by comparison with a local clock's timing signal.

Figure 1:
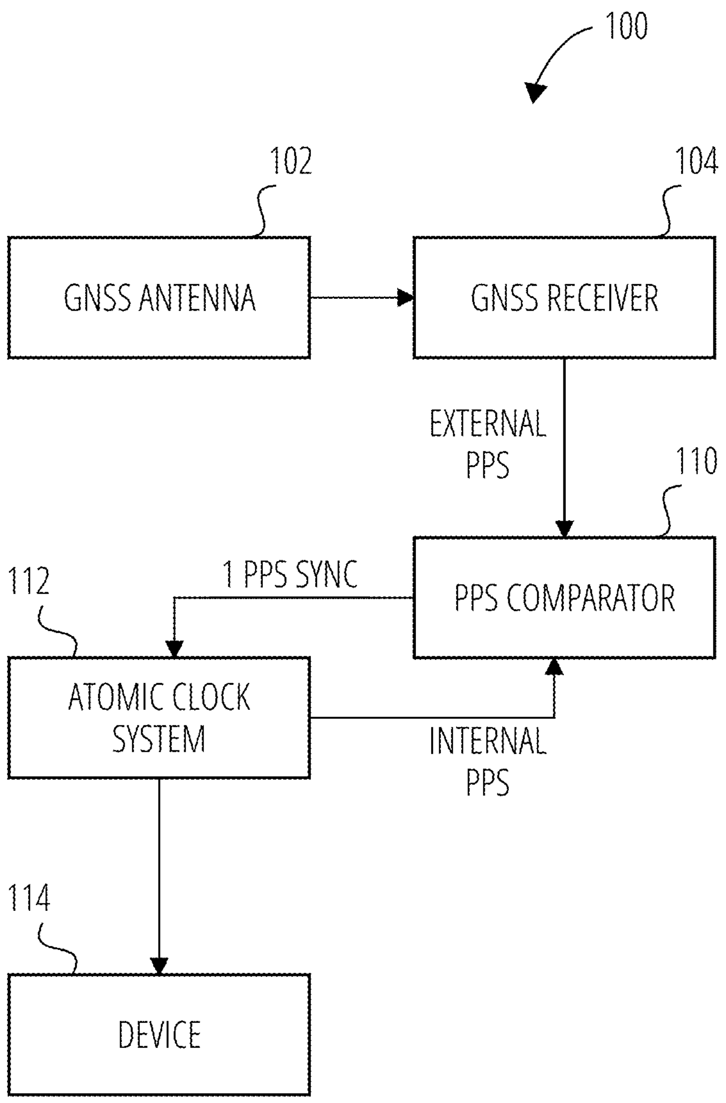
FIG. 1 is an example of portions of a system for detecting interference in a timing signal and providing an alternate timing signal.

FIG. 1 illustrates a system diagram of a comparator system 100 for detecting interference in a timing signal and providing an alternate timing signal. Global navigation satellite system (GNSS) signals can be susceptible to adversarial interference (jamming or spoofing). A system such as comparator system 100 can be used to switch between the GNSS signal output and the atomic signal output, using the atomic signal output as a backup timing reference when interference is detected in the GNSS signal.

The comparator system 100 can include or be coupled to a GNSS antenna 102, a GNSS receiver 104, a pulse-per-second (pps) (or other pulse-per-time) comparator 110, an atomic clock system 112, and a device 114.

In the comparator system 100, the pps comparator 110 receives respective 1 PPS (pulse-per-second or other pulse-per-time) timing signals from the GNSS receiver 104 ("external PPS") and the atomic clock system 112 ("internal PPS"). For devices (e.g., device 114) which rely on timing signals or frequency reference(s) to operate (e.g., navigation devices, autonomous vehicles, etc.), the GNSS signal can be considered more 'trustworthy' (e.g., stable) over long time periods such as hours and days. Timing signals from atomic clock systems can have a higher accuracy during shorter time periods, and can experience various environmental factors that can cause frequency drifts in the longer term.

During an initial synchronization (sync) period, atomic clock system 112 can steer the internal PPS signal (or other internal pulse-per-time signal generated by atomic clock system 112) to match the external PPS signal (or other external pulse-per-time signal derived from the GNSS receiver 104). Subsequently, divergence between the internal and external PPS signals can be used to detect interference. In some examples, the atomic clock system 112 can remain synchronized (or disciplined) to the external PPS signal while no interference is detected.

The pps comparator 110 can produce any suitable comparison signal. For example, the pps comparator 110 can compare the atomic clock system 112 against a threshold (e.g., "Is atomic clock system 112 within a specified threshold time period, e.g., 10 ns of the external clock signal"?). In another example, the pps comparator 110 can track differences between respective clock systems and can determine statistical trends in one or more of the differences (e.g. "Has one clock suddenly started drifting relative to the other in a statistically anomalous way?").

The pps comparator 110 can detect interference according to any suitable comparison criterion or criteria, and can generate any suitable alert signal when interference is detected according to the comparison criteria. For example, a user of device 114 can configure the comparator system 100 to trigger an alarm. In some examples, comparator system 100 can stop synchronization of the atomic clock system 112 to the external clock signal of the GNSS receiver 104 for a specified period of time. In this example, the period of time can be specified or otherwise configured by a user. In another example, the period of time can be indeterminate—that is, the atomic clock system 112 can remain unsynchronized (or undisciplined) to the GNSS signal until the comparator system 100 determines the interference is no longer present. During the period of time where the atomic clock system 112 is unsynchronized, the clock signal produced by the atomic clock system 112 can be designated to become the trusted reference for local time/frequency-sensitive device 114 instead of the GNSS clock signal.

Figure 2:
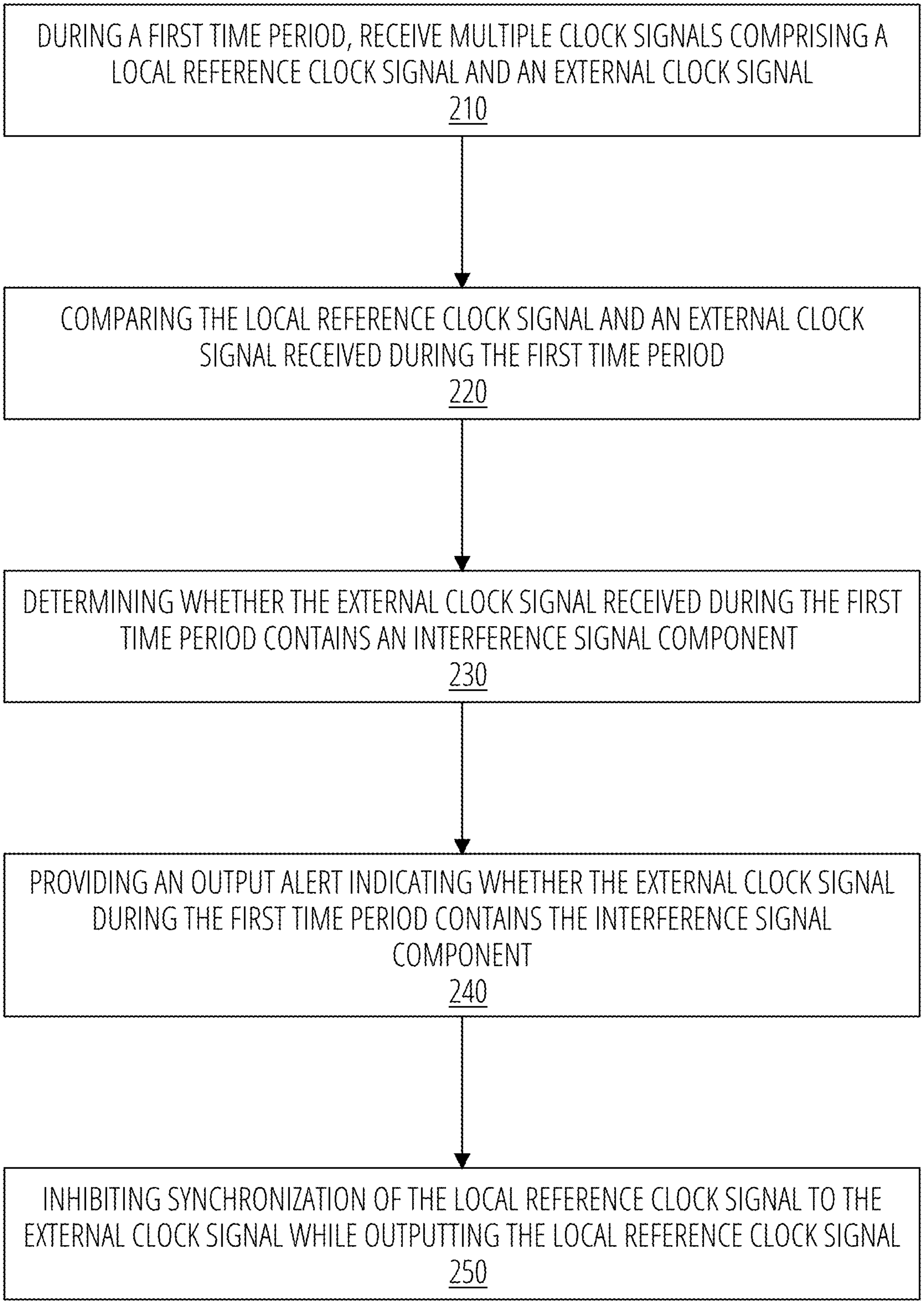
FIG. 2 is a flowchart of an example of portions of a method for detecting interference in an external clock signal.

FIG. 2 illustrates an example of a method 200 for detecting interference in an external clock signal. Although the example of the method 200 depicts a particular sequence of operations, the sequence may be altered. For example, some of the operations depicted may be performed in parallel or in a different sequence that does not materially affect the function of the method 200. In other examples, different components of an example device or system that implements the method 200 may perform functions at substantially the same time or in a specific sequence.

At 210, the method 200 can include receiving multiple clock signals comprising a local reference clock signal and an external clock signal during a first time period. For example, the local reference clock signal may be derived from an atomic system, such as an atomic clock. Additionally, in some examples, the external clock signal may be derived from a global navigation satellite system receiver, such as would receive a GPS-steered clock signal.

At 220, the method 200 can include comparing the local reference clock signal and an external clock signal received during the first time period. For example, the method 200 may compare a frequency for respective clock signals. In another example, method 200 may compare a drift between the two clock signals. In yet another example, method 220 may compare a phase between the two clock signals. In some examples, a previously measured value for the frequency, drift of the frequencies, or phase, of at least one of the local reference clock signal and the external clock signal can be used in the comparison at 220.

At 230, the method 200 can include determining whether the external clock signal received during the first time period includes an interference signal component. For example, the method 200 may include determining that a difference in the frequencies of the respective clock signals meets one or more pre-defined criteria (e.g., are different by a threshold, such as instantaneously or over a specified period of time).

At 240, the method 200 can include providing an output alert indicating whether the external clock signal during the first time period includes the interference signal component. In some examples, the output alert may be provided to a user-interface, a database, a broadcast channel, or any other suitable system relying on the external clock signal.

At block 250, according to some examples, the method 200 includes inhibiting synchronization of the local reference clock signal to the external clock signal while outputting the local reference clock signal.

The described method 200 may include additional implementations, such as any single implementation or any combination of implementations described below and/or in connection with one or more other methods 300 described elsewhere herein. For example, before detecting the interference at block 230, the external clock signal may be output. Further, based on detecting the interference at block 230, output of the external clock signal may include one or more additional signal components that characterize the external clock signal as having an interference signal component. In another example, output of the reference clock may be inhibited (e.g., stopped) as indicated at block 250 when the reference clock signal is determined to have an interference signal component.

Figure 3:
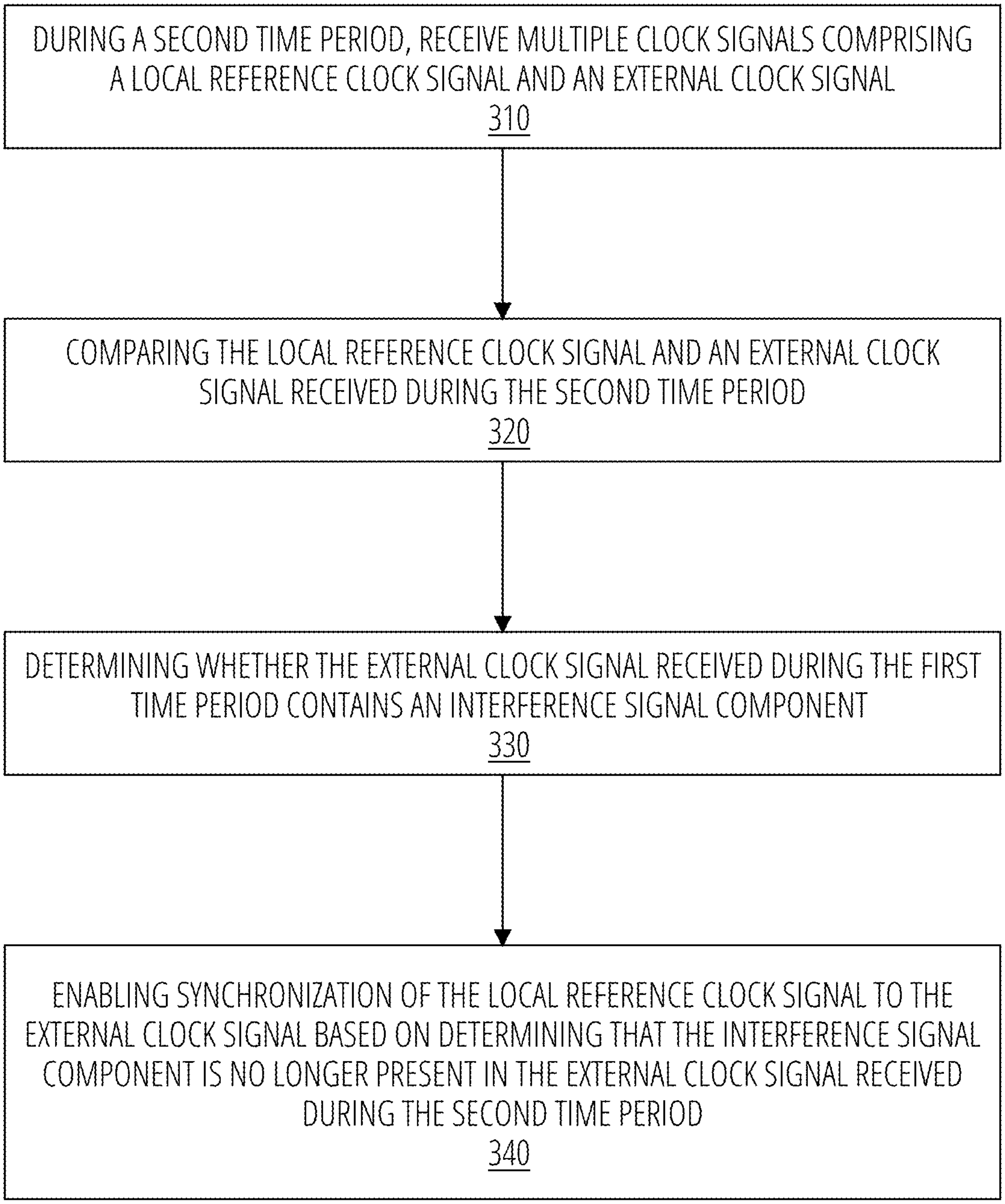
FIG. 3 is a flowchart of an example of portions of a method for detecting that interference previously detected in an external clock signal is no longer present.

FIG. 3 illustrates a flowchart of an example of a method 300 for detecting interference in an external clock signal. Although the example of the method 300 depicts a particular sequence of operations, the sequence may be altered. For example, some of the operations depicted may be performed in parallel or in a different sequence that does not materially affect the function of the method 300. In other examples, different components of an example device or system that implements the method 300 may perform functions at substantially the same time or in a specific sequence.

At 310, the method 300 can include, during a second time period, receiving multiple clock signals comprising a local reference clock signal and an external clock signal. For example, the second time period can be a sequential time period to the first time period. In another example, the second time period can be an aggregate of multiple time periods after the first time period.

At 320, the method 300 can include comparing the local reference clock signal and an external clock signal received during the second time period.

At 330, the method can include determining whether the external clock signal received during the first time period contains an interference signal component.

At block 340, according to some examples, the method 300 includes enabling synchronization of the local reference clock signal to the external clock signal based on determining that the interference signal component previously detected in the external clock signal (e.g., as determined at block 230 of method 200) is no longer present in the external clock signal received during the second time period.

Example 1 is a system, comprising: an atomic clock configured to provide a local reference clock signal and further configured to be disciplined to an external clock signal; an external clock interface configured to receive the external clock signal; a comparator configured to compare the local reference clock signal and the external clock signal and, in response, to: generate a comparison output signal; and an interference detection system configured to: receive the comparison output signal; based on the comparison output signal, determine whether the external clock signal has an interference signal component; output an alert signal indicating whether the external clock signal has the interference signal component; and inhibit disciplining of the local reference clock signal to the external clock signal.

In Example 2, the subject matter of Example 1 includes, wherein the atomic clock is co-located with the comparator.

In Example 3, the subject matter of Examples 1-2 includes, a global navigation satellite system receiver, wherein the global navigation satellite system receiver is configured to provide the external clock signal.

Example 4 is a method, comprising: receiving, during a first time period, multiple clock signals comprising a local reference clock signal and an external clock signal, wherein the local reference clock signal is derived from an atomic system; outputting the local reference clock signal; comparing the local reference clock signal and an external clock signal received during the first time period; determining whether the external clock signal received during the first time period contains an interference signal component based on the comparison; and providing an output alert indicating whether the external clock signal during the first time period contains the interference signal component.

In Example 5, the subject matter of Example 4 includes, based on determining whether the external clock signal received during the first time period contains an interference signal component: inhibiting disciplining of the local reference clock signal to the external clock signal.

In Example 6, the subject matter of Example 5 includes, receiving, during a second time period, multiple clock signals comprising the local reference clock signal and the external clock signal; comparing the local reference clock signal and the external clock signal received during the second time period; determining whether the interference signal component determined in the external clock signal received during the first time period is no longer present in the external clock signal received during the second time period based on the comparison; and resuming disciplining of the local reference clock signal to the external clock signal based on determining whether the interference signal component is no longer present in the external clock signal received during the second time period.

In Example 7, the subject matter of Examples 4-6 includes, including a time stamp in the output alert, wherein the time stamp indicates when the interference signal component was detected.

Example 8 is a non-transitory computer-readable storage medium, the computer-readable storage medium including instructions that when executed by a computer, cause the computer to: receive, during a first time period, multiple clock signals comprising a local reference clock signal and an external clock signal, wherein the local reference clock signal is derived from an atomic system; output the local reference clock signal; compare the local reference clock signal and an external clock signal received during the first time period; determine whether the external clock signal received during the first time period contains an interference signal component based on the comparison; and provide an output alert indicating whether the external clock signal during the first time period contains the interference signal component.

In Example 9, the subject matter of Example 8 includes, wherein the instructions further configure the computer to, based on determining whether the external clock signal received during the first time period contains an interference signal component: inhibit disciplining of the local reference clock signal to the external clock signal.

In Example 10, the subject matter of Example 9 includes, wherein the instructions further configure the computer to: receive, during a second time period, multiple clock signals comprising the local reference clock signal and the external clock signal; compare the local reference clock signal and the external clock signal received during the second time period; determine whether the interference signal component determined in the external clock signal received during the first time period is no longer present in the external clock signal received during the second time period based on the comparison; and resume disciplining of the local reference clock signal to the external clock signal based on determining whether the interference signal component is no longer present in the external clock signal received during the second time period.

In Example 11, the subject matter of Examples 8-10 includes, wherein the instructions further configure the computer to include a time stamp in the output alert, wherein the time stamp indicates when the interference signal component was detected.

Example 12 is at least one machine-readable medium including instructions that, when executed by processing circuitry, cause the processing circuitry to perform operations to implement of any of Examples 1-11.

Example 13 is an apparatus comprising means to implement of any of Examples 1-11.

Example 14 is a system to implement of any of Examples 1-11.

Example 15 is a method to implement of any of Examples 1-11.

The present techniques may be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the disclosure is provided above along with accompanying figures that illustrate the principles of the disclosure. The techniques are described in connection with such embodiments, but are not limited to any embodiment. The scope of the invention is limited only by the claims. Numerous specific details are set forth in the preceding description in order to provide a thorough understanding of the disclosure. These details are provided for the purpose of example and the techniques may be practiced according to the claims without some or all of these specific details. For the purpose of clarity, technical material that would be understood in the technical fields related to the present disclosure has not been described in detail so that the present disclosure is not unnecessarily obscured.

Although the foregoing embodiments have been described in some detail for purposes of clarity of understanding, the invention is not limited to the details provided. There are many alternative ways of implementing the present techniques. The disclosed embodiments are illustrative and not restrictive.

What is claimed is:

1. A system, comprising:

an atomic clock configured to continuously provide a local reference clock signal to a downstream device and further configured to be selectively disciplined to an external clock signal;

an external clock interface configured to receive the external clock signal;

a comparator configured to:

compare the local reference clock signal and the external clock signal; and in response to the comparison, generate a comparison output signal; and an interference detection system configured to:

receive the comparison output signal;

based on the comparison output signal, determine whether the external clock signal has an interference signal component;

output an alert signal indicating whether the external clock signal has the interference signal component; and inhibit disciplining of the local reference clock signal to the external clock signal when the external clock signal has the interference signal component, without requiring altering the local reference clock signal provided to the downstream device.

2. The system of claim 1, wherein the atomic clock is co-located with the comparator.

3. The system of claim 1, further comprising a global navigation satellite system receiver, wherein the global navigation satellite system receiver is configured to provide the external clock signal.

4. A method, comprising:

receiving, during a first time period, multiple clock signals comprising a local reference clock signal and an external clock signal, wherein the local reference clock signal is derived from an atomic clock;

disciplining the local reference clock signal to the external clock signal during the first time period;

continuously outputting the local reference clock signal to a downstream device without requiring altering the local reference clock signal;

comparing the local reference clock signal and an external clock signal received during the first time period;

determining whether the external clock signal received during the first time period contains an interference signal component based on the comparison;

inhibiting disciplining of the local reference clock signal to the external clock signal based on determining that the external clock signal received during the first time period contains an interference signal component; and providing an output alert indicating that the external clock signal during the first time period contains the interference signal component.

5. The method of claim 4, further comprising:

receiving, during a second time period, multiple clock signals comprising the local reference clock signal and the external clock signal;

comparing the local reference clock signal and the external clock signal received during the second time period;

determining that the interference signal component determined in the external clock signal received during the first time period is no longer present in the external clock signal received during the second time period based on the comparison; and resuming disciplining of the local reference clock signal to the external clock signal based on determining that the interference signal component is no longer present in the external clock signal received during the second time period.

6. The method of claim 4, further comprising including a time stamp in the output alert, wherein the time stamp indicates when the interference signal component was detected.

7. A non-transitory computer-readable storage medium, the computer-readable storage medium including instructions that when executed by a processor, cause the processor to perform operations comprising:

receive, during a first time period, multiple clock signals comprising a local reference clock signal and an external clock signal, wherein the local reference clock signal is derived from an atomic clock;

discipline the local reference clock signal to the external clock signal during the first time period;

continuously output the local reference clock signal to a downstream device without requiring altering the local reference clock signal;

compare the local reference clock signal and an external clock signal received during the first time period;

determine that the external clock signal received during the first time period contains an interference signal component based on the comparison;

based on determining that the external clock signal received during the first time period contains an interference signal component, inhibit disciplining of the local reference clock signal to the external clock signal; and provide an output alert indicating whether the external clock signal during the first time period contains the interference signal component.

8. The computer-readable storage medium of claim 7, wherein the instructions further configure the processor to:

receive, during a second time period, multiple clock signals comprising the local reference clock signal and the external clock signal;

compare the local reference clock signal and the external clock signal received during the second time period;

determine that the interference signal component determined in the external clock signal received during the first time period is no longer present in the external clock signal received during the second time period based on the comparison; and resume disciplining of the local reference clock signal to the external clock signal based on determining that the interference signal component is no longer present in the external clock signal received during the second time period.

9. The computer-readable storage medium of claim 7, wherein the instructions further configure the processor to include a time stamp in the output alert, wherein the time stamp indicates when the interference signal component was detected.

* * * * *